United States Patent
Metz et al.

(10) Patent No.: US 9,396,958 B2
(45) Date of Patent: Jul. 19, 2016

(54) SELF-ALIGNED PATTERNING USING DIRECTED SELF-ASSEMBLY OF BLOCK COPOLYMERS

(71) Applicant: Tokyo Electron Limited, Minato-ku, Tokyo (JP)

(72) Inventors: Andrew W. Metz, Watervliet, NY (US); Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/865,128

(22) Filed: Sep. 25, 2015

(65) Prior Publication Data

US 2016/0104628 A1   Apr. 14, 2016

Related U.S. Application Data

(60) Provisional application No. 62/063,462, filed on Oct. 14, 2014.

(51) Int. Cl.
*H01L 21/30* (2006.01)
*H01L 21/308* (2006.01)

(52) U.S. Cl.
CPC ........ *H01L 21/3086* (2013.01); *H01L 21/3081* (2013.01); *H01L 21/3088* (2013.01)

(58) Field of Classification Search
None
See application file for complete search history.

(56) References Cited

U.S. PATENT DOCUMENTS

| 5,032,216 A | 7/1991 | Felten |
| 2009/0104550 A1 | 4/2009 | Chen |
| 2009/0233236 A1* | 9/2009 | Black ............... B82Y 10/00 430/311 |
| 2012/0127454 A1* | 5/2012 | Nakamura ........... G03F 7/0002 355/77 |
| 2013/0133825 A1 | 5/2013 | Hattori et al. |
| 2013/0140272 A1 | 6/2013 | Koole et al. |

FOREIGN PATENT DOCUMENTS

JP   2014-164043   9/2014

OTHER PUBLICATIONS

International Patent Application No. PCT/US2015/053802, "International Search Report and Written Opinion," mailed Dec. 28, 2015, International application filing date Oct. 2, 2015.

* cited by examiner

*Primary Examiner* — Seahvosh Nikmanesh

(57) ABSTRACT

Techniques herein provide methods for self-aligned etching that use existing features for patterning or registering a pattern, without damaging existing features. Existing substrate structures are used to create a surface that enables directed self-assembly (DSA) of block copolymers (BCP) without a separate lithographic patterning layer. Methods herein include recessing at least one existing material or structure on a substrate, and adding a film that remains on the recessed material only. This film can be selected to have a preferential surface energy that enables controlled self-assembly of block copolymers. The substrate can then be etched using both existing structures and one polymer material as an etching mask. One example advantage is that self-assembled polymer material can be located to protect exposed corners of existing features, which reduces a burden of selective etch chemistry, increases precision of subsequent etching, and reduces sputter yield.

20 Claims, 3 Drawing Sheets

US 9,396,958 B2

SELF-ALIGNED PATTERNING USING DIRECTED SELF-ASSEMBLY OF BLOCK COPOLYMERS

CROSS REFERENCE TO RELATED APPLICATIONS

The present application claims the benefit of U.S. Provisional Patent Application No. 62/063,462, filed on Oct. 14, 2014, entitled "Self-Aligned Patterning using Directed Self-Assembly of Block Copolymers," which is incorporated herein by reference in its entirety.

BACKGROUND OF THE INVENTION

This disclosure relates to etching features in substrates, including patterning processes for etching substrates.

The fabrication of integrated circuits (IC) in the semiconductor industry typically involves using a plasma reactor to create plasma that assists surface chemistry used to remove material from—and deposit material to—a substrate. Dry plasma etching processes are routinely used to remove or etch material along fine lines or within vias or at contacts patterned on a semiconductor substrate. A successful plasma etching process requires an etching chemistry that includes chemical reactants suitable for selectively etching one material while not etching another material (not substantially etching). Etching processes are typically used in conjunction with a patterned mask.

For example, on a semiconductor substrate a relief pattern formed in a protective layer can be transferred to an underlying layer of a selected material using a directional plasma etching process. The protective layer can comprise a light-sensitive layer, such as a photoresist layer, having a latent pattern formed using a lithographic process, and then this latent pattern can be developed into a relief pattern by dissolving and removing selected portions of the photoresist layer. Once the relief pattern is formed, the semiconductor substrate is disposed within a plasma processing chamber, and an etching chemistry is formed that selectively etches the underlying layer while minimally etching the protective layer.

This etch chemistry is produced by introducing an ionizable, dissociative gas mixture having parent molecules comprising molecular constituents that react with the underlying layer while minimally reacting with the protective or patterning layer. Production of the etch chemistry comprises introduction of a gas mixture and formation of plasma when a portion of the gas species present are ionized following a collision with an energetic electron. Heated electrons can serve to dissociate some species of the gas mixture and create a reactive mixture of chemical constituents (of the parent molecules). Accordingly, various substrate materials can be controllably removed or deposited using various patterning and etch processes.

SUMMARY

There has been a continuous drive to scale down or shrink transistors, memory arrays, and other semiconductor devices to increase density and improve processing performance. As critical dimensions of semiconductor device features shrink, it becomes more difficult to accurately fabricate structures and accurately etch various layers in the fabrication process. For example, it is becoming increasingly difficult to accurately etch for contacts, memory array cross point architecture, slot contacts, etc., especially when sub-resolution (sub-lithographic resolution) patterning is needed. By way of a specific example, as critical dimensions of transistors shrink, it becomes more difficult to make accurate connections to source and drain. This is especially true with FinFET transistors. For example, considering a gate pitch of 80 nanometers or greater (within lithographic resolution), a mask pattern for source or drain contact etch consistently lands between gates of a transistor using conventional patterning technology and without using protective cap layers. With a shrinking gate pitch, however, lithographic overlay misalignment becomes a significant problem. With misalignment, etch steps can create shorts between source/drain and gate electrodes because the etch pattern can overlap both the gate and the source or drain.

One technique to etch sub-resolution features is a self-aligned etch technique in which existing, non-sacrificial or place holder structures are used as a mask for etching features, such as contacts. Self-aligned etch techniques rely heavily on etch selectivity because existing structures—both those to be etched and those to remain—are exposed to etchants. Etch selectivity, however, is not perfect and such imperfection results in undesirable etching of one or more materials leading to defects, contamination, compromised profiles, etc. One technique to assist with self-aligned etches and prevent loss of needed or existing structures is to add protective layers. For example, a gate cap can be used to compensate for such overlay error by functioning as a protective cap as part of a self-aligned contact (SAC) etch. The gate cap helps to protect a gate structure when etching to create a channel for source/drain contacts. Such a protection cap is still not a problem-free solution. Such caps are typically too thin for adequate etch protection. Simply increasing cap height, however, is not a desirable solution because this increases an aspect ratio, which makes gate etch more difficult and also makes it more difficult for subsequent void-free oxide fills. Another challenge with using shorter caps is that exposed cap corners have a higher sputter yield and thus erode faster leading to shorts.

Techniques herein, however, provide methods for self-aligned etching that use existing features for patterning or registering a pattern, but without damaging existing features. That is, techniques herein enable etching using existing features on a substrate as an etch guide, without needing a lithographically patterned layer. Techniques herein thus provide, accurate (self-aligned) sub-resolution etching without damaging existing structures.

Techniques herein use existing substrate structures to create a surface that enables directed self-assembly (DSA) of block copolymers (BCP) without a separate lithographic patterning layer. Methods herein include recessing at least one existing material or structure on a substrate, and adding a film that remains on the recessed material only. This film can be selected to have a preferential surface energy that enables controlled self-assembly of block copolymers. The substrate can then be etched using both existing structures and one polymer material as an etching mask. One example advantage is that self-assembled polymer material can be located to protect exposed corners of existing features, which reduces a burden of selective etch chemistry, increases precision of subsequent etching, and reduces sputter yield.

One example application for techniques herein can be applied to self-aligned patterning. A substrate is provided having a first structure of a first material, a second structure of a second material, and the third structure of a third material. The second material differs from the first material and the third material. The first structure and the third structure both have approximately vertical interfaces with the second structure. The first structure is positioned on a first side of the second structure and the third structure is positioned on an opposing side of the second structure. A top surface of the first structure, a top surface of the second structure, and a top surface of the third structure are all horizontal and substantially coplanar with each other.

An upper portion of the second structure is removed such that a resulting top surface of the second structure is vertically lower than the top surface of the first structure and vertically lower than the top surface of the third structure. A planarization layer is deposited on the substrate. The planarization layer covers the first, second, and third structures. This planarization layer provides a top surface that is horizontally planar. A solubility-changing agent is deposited on the top surface of the planarization layer. The solubility-changing agent can then be activated such that the solubility-changing agent changes a solubility of a top portion of the planarization layer. This top portion of the planarization layer extends vertically from the top surface of the planarization layer down to at least the top surface of the first and second structures. The top portion of the planarization layer is then removed such that the planarization layer material is removed from the top surface of the first structure and the third structure. A film or portion of planarization layer material remains on the resulting top surface of the second structure as a pre-pattern film.

The substrate now provides a chemical pattern for directed self-assembly of block copolymers in that existing structures now have a surface energy differentiation. The substrate can also have differing surface heights thereby additionally providing a topographical or relief pre-pattern for directed self-assembly of block copolymers. A mixture of block copolymers can then be deposited on the substrate. Phase separation of block copolymers can be activated to result in preferential self-assembly such that polymer structures of a first polymer material, that is etch-resistant, being positioned at locations to prevent exposure of corners of the first and second structures to etchants during an etch process. After removing polymer structures of a second polymer material, a self-aligned etch process can be accurately executed without damaging existing structures. Eliminating photolithographic patterning steps to enable directed self-assembly of block copolymers significantly reduces fabrication costs.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques herein provide methods for self-aligned etching that use existing structures for patterning including pre-patterning of directed self-assembly of block copolymers. Methods herein enable etching using existing features on a substrate as an etch guide, without needing a lithographically patterned layer. Techniques herein thus provide, accurate, sub-resolution etching without damaging functionality of existing structures or devices by using self-alignment techniques.

Techniques herein use existing substrate structures to create a surface that enables directed self-assembly of block copolymers without a separate lithographic patterning layer. Methods herein include recessing at least one material and adding a film that remains on recessed material only. This film has a preferential surface energy to enable controlled self-assembly. The substrate can then be etched anisotropically using both existing structures and one polymer material as an etching mask. One example advantage is that self-assembled polymer material can be located to protect exposed corners of existing features to increase precision of subsequent etching and to reduce sputter yield.

Methods herein enable self-aligned etching techniques. Self-aligned etching is a fabrication technique used to ensure that locations being etched are aligned with, or directly registered to, underlying features, in contrast to indirect alignment using reference alignment marks. For example, with self-aligned contact etching such an etch technique ensures that an etch process etches an opening for a contact that lands on a source/drain, but that does not electrically short to a gate. The self-aligned etching techniques herein can be used for opening material in many varied applications such as contact etching, slot contacts, memory arrays, as well as for self-aligned vias (SAV) such as in back-end-of-line operations. For convenience in describing embodiments herein, however, example descriptions and illustrations will primarily focus on a self-aligned contact etch for source/drain contact placement.

Figure 1:
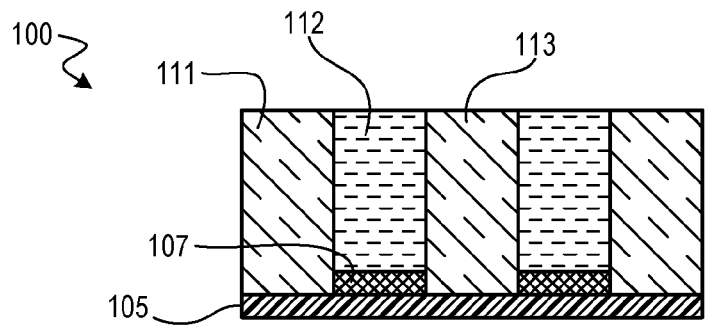
FIG. 1 is a cross-sectional schematic view of an example substrate segment showing process flow according to embodiments disclosed herein.

One embodiment includes a method for self-aligned patterning. Referring now to FIG. 1, a cross-sectional schematic segment of an example substrate is shown. In this method a substrate 100 is provided having a first structure 111 of a first material, a second structure 112 of a second material, and a third structure 113 of a third material. This second material is different from the first material and also from the third material. In some embodiments the first material and the third material can be identical. The first structure 111 and the third structure 113 both have an approximately vertical interface with the second structure 112. In semiconductor fabrication, structures are fabricated to have (or result in due to material limitations) a vertical surface that is sloped at some angle relative to a vertical axis. This angle can be, for example, up to 10 degrees or more and is would still be considered a vertical surface or interface in this context. Indeed such sloping can assist with avoiding voids when filling between features. The first structure 111 is positioned on a first side of the second structure 112 and the third structure 113 is positioned on an opposing side and the second structure 112. In other words, the first and third structures form a pair of structures with the second structure in between this pair of structures. A top surface of the first structure, a top surface of the second structure, and a top surface of the third structure are all horizontal and substantially coplanar with each other.

First structure 111 can be a gate structure which is either permanent or partially sacrificial such as being used to create a replacement metal gate structure. For simplicity, first structure 111 is shown as a single material, but in practice such a structure can include a tungsten plug, high-K materials, work function metal, and sidewall spacers and cap, which cap and sidewalls can be made of silicon nitride. The second material, used for creating second structure 112, can be an oxide material. Fabricating a substrate for the example starting point shown in FIG. 1 can involve filling gaps between gate structures with a flowable oxide material which initially covers the substrates and/or gate structures and is then planarized to yield the cross-sectional schematic shown in FIG. 1. Planarization can be accomplished using chemical mechanical polishing (CMP), which is a known technique. The oxide material of FIG. 1 can be covering source/drain 107. Layer 105 can include one or more underlying layers and/or structures.

A given conventional self-aligned contact etch technique can then specify etching the oxide material relative to a gate structure material until source/drain 107 is exposed. Unfortunately, as oxide material is etched away using dry plasma etching, corners of first structure 111 and third structure 113 become exposed to plasma constituents and start to be etched faster—even when the etch chemistry has high selectivity to silicon nitride material. The sputter yield of any energetic ion onto a surface is related to its incident angle. Thus, sputter yield on a horizontal surface is much lower than that on a corner. An exposed corner, however, essentially results in corner rounding and accelerated etching, which can reveal a protected gate material and cause shorts.

Figure 2:
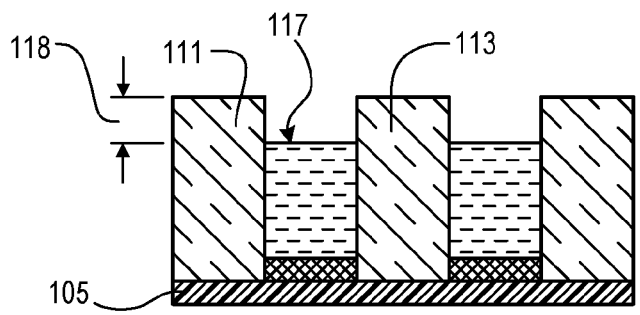
FIG. 2 is a cross-sectional schematic view of an example substrate segment showing process flow according to embodiments disclosed herein.

Referring now to FIG. 2, a material recess or oxide recess process is executed, which can be a partial etch of planarized material of one of the structures. Alternatively, selective deposition can increase a height of one of the materials. In the example figures, this material removal can be a partial etch of a planarized oxide film material, corresponding to second structure 112 and structures of the same material. In one process step an upper portion of the second structure 112 is removed such that a resulting top surface 117 (recessed surface) of the second structure 112 is vertically lower (118) than the top surface of the first structure and also of the third structure (since the first and third structures are coplanar). Note in FIG. 2 that by removing an upper portion of second structure 112, second structure 112 now appears to be recessed below first structure 111 and third structure 113.

Removing the upper portion of the second structure 112 can include executing an etch process that selectively etches the second material relative to the first material and the third material. In some embodiments, executing the etch process can include executing a non-plasma gaseous etch process. Such a non-plasma gaseous etch process can include executing a chemical oxide removal (COR) process using hydrogen fluoride (HF) and ammonia ($NH_3$). Alternatively, executing the etch process can include executing a plasma-based reactive ion etch. Thus, a predetermined etch chemistry (one or more) can be used to selectively etch one material with respect to another material. Depending on a given material in the substrate to be etched, other removal processes, such as ashing and wet etch, can be used. For non-oxide materials, atomic layer etching (ALE) can be executed. Other techniques can include selective deposition and removal, selective atomic layer deposition (ALD), planarization, and etch back. In some embodiments, selective deposition on the first structure 111 and the third structure 113 can be executed to build up those structures instead of recessing second structure 112.

Using chemical oxide removal for this recess step can be advantageous because COR oxide removal is highly controllable. An example chemical oxide removal uses a mixture of HF and $NH_3$ in a ratio of approximately 2:1, with a reaction carried out at pressures below 15 mTorr at 25 degrees Celsius to form solid ammonium bexafluorosilicate, followed by evaporation at a temperature over 100 degrees Celsius. Thus, a self-limited modification layer can be thermally sublimed off of the substrate. Such a COR treatment is generally known. Such chemical oxide removal enables a very controlled process for precise trim or etch depth.

After completing the chemical oxide removal step or alternative step for partially removing material (creating a recess), the substrate 100 is no longer fully planar but now defines a topography. The majority of semiconductor manufacturing materials (to remain on a wafer) do not typically provide a usable neutral layer for effective directed self-assembly of block copolymers. Accordingly, techniques herein essentially add a material to the second structure 112 that provides a preferential surface energy differentiation or wetting angle differentiation. Deposition of such material can include depositing an overcoat of developable material followed by vertical solubility shifting and layer development.

Figure 3:
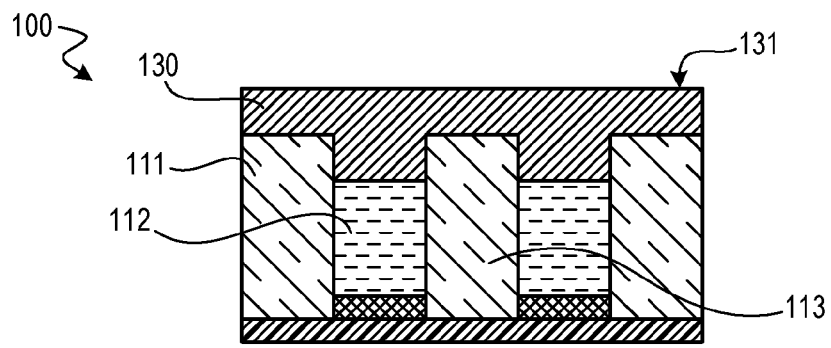
FIG. 3 is a cross-sectional schematic view of an example substrate segment showing process flow according to embodiments disclosed herein.

Referring now to FIG. 3, planarization layer 130 is deposited on the substrate 100. This planarization layer 130 covers the first structure 111, the second structure 112, and the third structure 113. The planarization layer has a top surface 131 that is horizontally planar. The planarization layer 130 can include a solubility changeable material that can change its solubility in response to contact with, or influence from, a solubility-changing agent. In some embodiments this material is an organic material and/or photoresist. By way of a non-limiting embodiment, depositing the planarization layer can include depositing a developable anti-reflective coating which can include a silicon-containing material.

Figure 4:
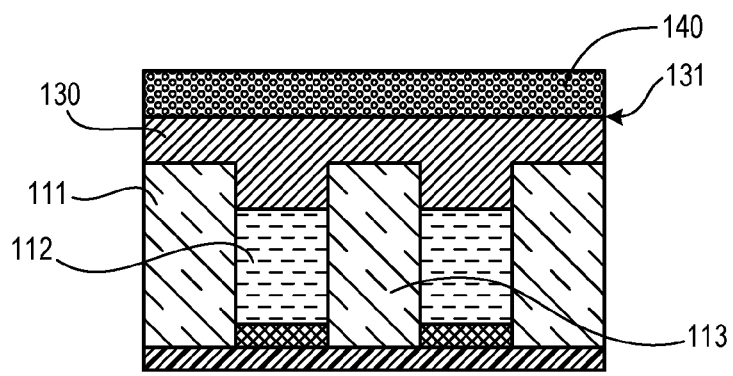
FIG. 4 is a cross-sectional schematic view of an example substrate segment showing process flow according to embodiments disclosed herein.

Referring now to FIG. 4, a solubility-changing agent 140 is deposited on the top surface 131 of the planarization layer 130. In some embodiments the solubility-changing agent includes an acid, and/or can be deposited using vapor exposure deposition. Alternative embodiments can deposit this material via a spin-on deposition of a liquid agent.

Figure 5:
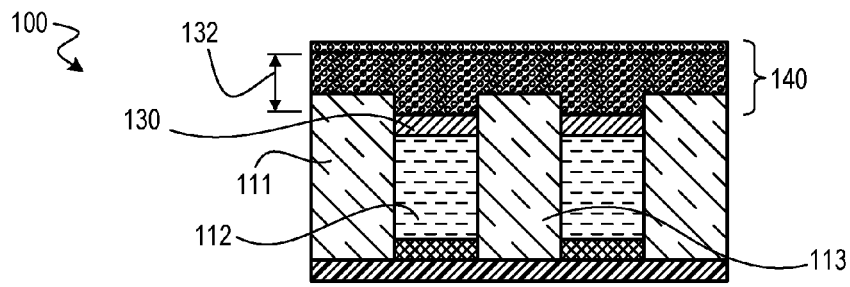
FIG. 5 is a cross-sectional schematic view of an example substrate segment showing process flow according to embodiments disclosed herein.

Referring now to FIG. 5, the solubility-changing agent is activated such that the solubility-changing agent changes a solubility of a top portion 132 of the planarization layer 130. The top portion 132 of the planarization layer 130 extends vertically from the top surface of the planarization layer to at least the top surface of the first structure 111 and the top surface of the third structure 113. An example depth is corresponds to top portion 132 of FIG. 5. In other words, for example, an acid diffusion process can be executed that enables developable planarization which can be executed on a coater/developer tool. In some embodiments, activating the solubility-changing agent can include heating the solubility-changing agent such that the solubility-changing agent diffuses into the planarization layer 130 to a predetermined depth and changes a solubility of the top portion of the planarization layer. In other embodiments, heating the solubility-changing agent includes controlling the parameters such that diffusion of the solubility-changing agent stops at about the predetermined depth. More details on executing such a distance-based acid diffusion and development step can be found in U.S. patent application Ser. No. 61/901,768 filed on Nov. 8, 2013 entitled "Method for Chemical Polishing and Planarization," which is herein incorporated by reference in its entirety.

Figure 6:
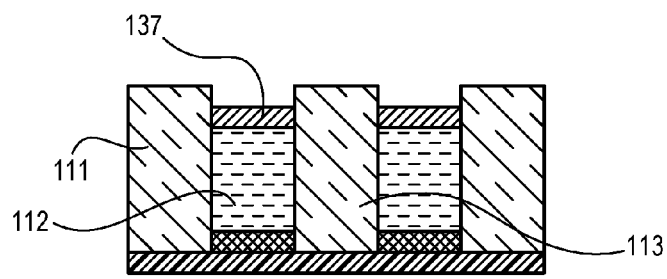
FIG. 6 is a cross-sectional schematic view of an example substrate segment showing process flow according to embodiments disclosed herein.

Referring now to FIG. 6, the top portion 132 of the planarization layer 130 is removed such that planarization layer material is removed from the top surface of the first structure 111 and removed from the top surface of the third structure 113. This removal leaves a pre-pattern film 137 that remains on the resulting top surface of the second structure 112. The pre-pattern film 137 is a film comprised of remaining planarization layer material (after removal of the top portion 132). In one embodiment, the pre-pattern film 137 has a wetting angle that differs from a wetting angle of the first material and the second material. In other words, substrate 100 of FIG. 6 now has a top surface of differing surface energies or different wetting angles which provides a chemo-epitaxy basis for directing self-assembly of block copolymers. By way of a non-limiting example, a hydrophobic and/or hydrophilic difference between a developable anti-reflective coating material and silicon nitride can help provide a template for phase segregation.

To provide such a differentiation in surface energies, the planarization layer material (top portion) needs to be removed down to at least the top surfaces of the first and third structures. Removing the planarization layer material to a level below the top surfaces of the first and third structures can provide a grapho-epitaxial surface in addition to the chemo-epitaxial surface. Thus, in some embodiments, a top surface of the pre-pattern film 137 is lower than the top surface of the first structure 111 and the top surface of the third structure 113 such that a sidewall of the first structure and a sidewall of the third structure are exposed providing a relief pattern for self-assembly of block copolymers. In other words, chemical diffusion of a photo acid for a specific amount of time or amount followed by developing a newly soluble material provides a structure for executing grapho-epitaxy and/or chemo epitaxy. Note that in some embodiments, executing only the chemical oxide removal (material recess) can provide a grapho-epitaxy pattern for directed self-assembly. This graphical pattern can then be enhanced by the planarization layer material surface energy properties.

Figure 7:
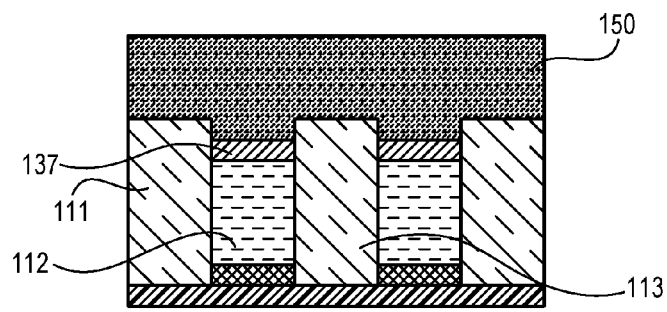
FIG. 7 is a cross-sectional schematic view of an example substrate segment showing process flow according to embodiments disclosed herein.

Referring now to FIG. 7, a block copolymer mixture 150 can be deposited on the substrate 100. Deposition can be executed via a spin-on deposition of a liquid mixture. Selection of a particular block copolymer mixture can include selecting one material that is etch-resistant as compared to a companion material in the mixture.

Figure 8A:
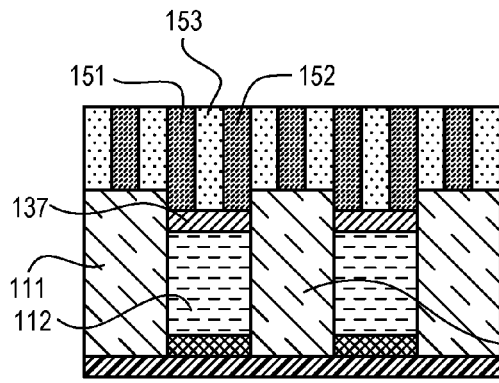
FIGS. 8A and 8B are cross-sectional schematic view of an example substrate segment showing alternative process flows according to embodiments disclosed herein.

Referring now to FIG. 8A, phase-separation of block copolymer mixture 150 is caused such that self-assembly results in a first polymer structure 151 of the first polymer material positioned on the pre-pattern film 137 and positioned with a sidewall of the first polymer structure 151 aligned with the (approximately) vertical interface of the first structure 111 and second structure 112. Self-assembly also results in a second polymer structure 152 of the first polymer material positioned on the pre-pattern film 137 and positioned with a sidewall of the second polymer structure 152 aligned with the approximately vertical interface of the third structure 113 and the second structure 112. Self-assembly also results in a third polymer structure 153 of a second polymer material positioned between the first polymer structure 151 and the second polymer structure 152. In other words, polymer structures of a first polymer material self-assemble at edges of the pre-pattern film 137. This is repeated on other structures having the pre-pattern film. On the first structure 111 and the third structure 113 polymer structures of the first and second materials also self-assemble in an alternating pattern of polymer structures.

In embodiments in which a top surface of the pre-pattern film 137 is positioned below the top surface of the first structure 111 and the top surface of the third structure 113, there are sidewalls of the first structure 111 in the third structure 113 that are exposed prior to deposition of a given block copolymer mixture. In such embodiments a sidewall of the first polymer structure 151 abuts with a sidewall of the first structure 111 and a sidewall of the second polymer structure 152 abuts with a sidewall of the third structure 113. In other words, at least three polymer structures self-assemble on the pre-pattern film 137. Block copolymer chain length and type of material can be selected such that three polymer structures self-assemble over the recessed structure. A number of lines that form within a given space (such as between gate structures) is tunable by selecting block copolymers having a particular chain length based on a given critical dimension (CD) of a trench or template. For example, if a given template CD is 7 nm, then a chain length of block copolymers is selected to phase separate into three lines (polymer structures) within the trench such that a first etch resistant copolymer forms a line along an exposed edge or corner.

In some embodiments, the first polymer material can be etch resistive relative to the second polymer material. Various copolymer materials are known. One common mixture is that of polystyrene (PS) and polymethyl methacrylate (PMMA). To remove PMMA relative to PS, plasma created from argon and oxygen can be used to etch the PMMA component while leaving the PS component. Adjusting various parameters can improve etch selectivity such as temperature control, bias control, and adding a negative direct current superimposed on an upper electrode plate to generate a ballistic electron flux through the plasma to strike the polymer materials. In other embodiments, the PMMA can be removed using a wet chemistry on a coater/developer tool.

Figure 9A:
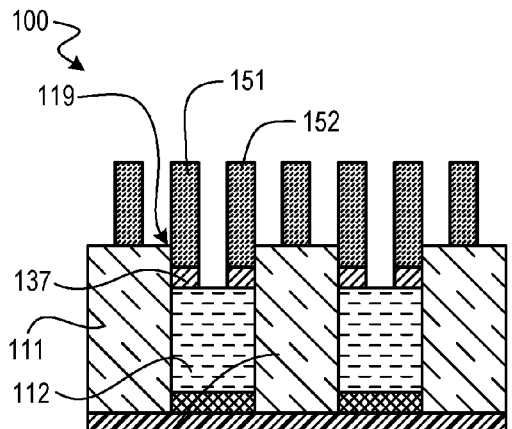
FIGS. 9A and 9B are cross-sectional schematic view of an example substrate segment showing alternative process flows according to embodiments disclosed herein.

Accordingly, the third polymer structure 153 can be removed while the first polymer structure 151 and the second polymer structure 152 remain on the substrate. Moreover, polymer structures having a same material as third polymer structure 153 are also removed. FIG. 9A shows an example result of substrate 100 after removing one of the self-assembled polymer materials. The resulting pattern of polymer structures that is etch resistant can then be used as a mask to enhance or augment the ability of a self-aligned etch process. Note that corner 119 of first structure 111 is now protected by first polymer structure 151. The location of first polymer structure 151 means that during a subsequent etch process there is no exposed corner of first structure 111, thereby reducing sputter yield and essentially increasing in etch selectivity between, for example, an oxide material and a silicon nitride material. Although surfaces of first structure 111 are still exposed to etchants, with the corner protected etch selectivity is greatly enhanced.

Figure 10:
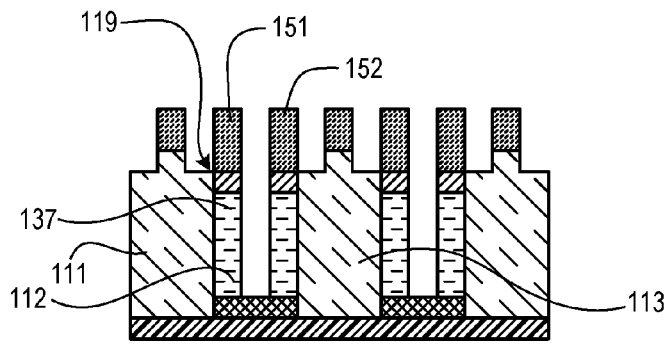
FIG. 10 is a cross-sectional schematic view of an example substrate segment showing process flow according to embodiments disclosed herein.

Referring now to FIG. 10 an etch step can be executed that uses the first structure 111, the third structure 113, the first polymer structure 151, and the second polymer structure 152 as a mask for etching through the second structure 112 of the second material. Depending on etch chemistry and material used on the substrate 100, there can be some pull-down of the polymer structures and of first structure 111 and third structure 113. With techniques herein, however, this pull-down is minimal or acceptable, especially since there is no corner rounding that leads to shorts or undesirable performance. The additional mask elements of first polymer structure 151 and second polymer structure 152 also ensure that a contact in the middle of a pair of gates or other structures, and thus does not touch a sidewall of, for example, a nitride spacer. Maintaining a dielectric on a sidewall means less chance for electrical breakdown.

Figure 11:
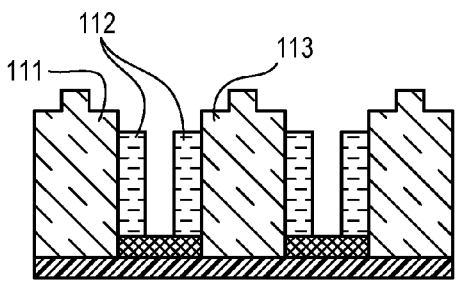
FIG. 11 is a cross-sectional schematic view of an example substrate segment showing process flow according to embodiments disclosed herein.
Figure 12:
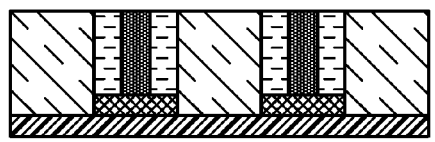
FIG. 12 is a cross-sectional schematic view of an example substrate segment showing process flow according to embodiments disclosed herein.

After completing this etch process, remaining polymer materials and planarizing materials can be removed from the substrate. Such removal can be executed in multiple steps depending upon material compositions. Polymer materials can typically be removed using an ashing process. FIG. 11 shows an example result of such an etch step. Additional fabrication steps can now be continued. In a specific example, an opening has been etched to reveal an underlying source/drain. The etched contact opening can then be filled with a metal, which can include a metal overfill followed by a chemical-mechanical polishing (CMP) step which can result in the example substrate structure as shown in FIG. 12.

Example embodiments herein have been described primarily in the context of line/space self-assembly of block copolymers. Note that techniques herein are not limited to line/space patterning, but can also be used for cylinder and hole patterning. Thus, in addition to registering DSA patterns to line-shaped or slot-shaped structures in existing substrates, DSA patterns can also be registered to cylinder-shaped structures in a given substrate. For example, second structure 112 of FIG. 1 can be a cylindrical structure with first structure 111 and third structure 113 both being a same structure or material layer that surrounds second structure 112. The subsequent process flow as described above can then be applied to pre-pattern cylindrical structures. Cylindrical structures are recessed below a planar top surface of the substrate. A developable material is applied to the substrate. A top-down acid diffusion process then changes a solubility of a top portion of the developable material which is then dissolved and removed thereby leaving developable material only on the cylindrical structures. The result is a substrate surface having a desirable surface energy differentiation for preferential self-assembly of block copolymers. In other words, a given substrate provides a functional chemo-epitaxial DSA pre-pattern registered to existing structures on the substrate. If a top surface of the developable material is positioned or recessed below an initial top surface of the substrate, then a self-aligned graphoepitaxial and chemo-epitaxial hybrid pre-pattern is created. By selecting specific block copolymer chain lengths for the block copolymer mixture for a specific critical dimension, a preferential self-assembly can result. For example, one result can be an inner cylinder of a second polymer material formed at a center point of second structure 112, and also an outer cylinder (hollow cylinder) that surrounds the inner cylinder and extends to an edge portion of the second structure 112 to protect any exposed corners of material surrounding second structure 112.

One benefit of such techniques is improved self-alignment for a contact opening etch. With techniques herein, there is no need to rely on precision of a 193 nm stepper to pattern or align these structures with an existing gate. Thus, techniques herein can eliminate two critical stepper passes, which can reduce fabrication costs substantially.

As disclosed above, techniques herein can be applied to several different types of fabrication operations such as contact etching, slot contacts, memory arrays, self-aligned vias (SAV), and so forth. As can be appreciated, minor changes and additions to methods herein can be made to enable different fabrication applications. For example, in the SAV application, execution can include self-aligned placement of an additional mask, which can be useful to protect titanium nitride (TiN) material that might be exposed. In other embodiments, a lithographically applied mask can be used for blocking particular memory areas, creating a particular spacing ratio, or confining a pattern in an orthogonal direction.

Modifications can also be made to polymer chain length selection for particular self-assembled results. For example, with self-aligned contact applications, it is beneficial for three DSA structures to be assembled within a contact opening (with the middle structure subsequently removed as shown in FIG. 8A) because this protects against corner rounding and accurately locates a contact opening between adjacent structures for better etch results. With three DSA structures being formed within contact openings, two or more DSA structures would form on adjacent structures, which means that (although no corner is exposed) material from adjacent structures will be exposed to etchants from subsequent pattern transfer. Although this exposure to etchants is acceptable for certain materials (for example, because of high etch selectivities), any exposure to etchants may not be acceptable for other types of materials or for material layers that are very thin and thus essentially have no acceptable loss amount. For example, a thin layer of TiN on adjacent structures may need to be protected. In such schemes, DSA copolymer selection can be such that one DSA structure forms in a VIA to be etched, while opposing DSA structures form on adjacent structures thereby completely protecting any material or film that should not be exposed to etchants.

Figure 8B:
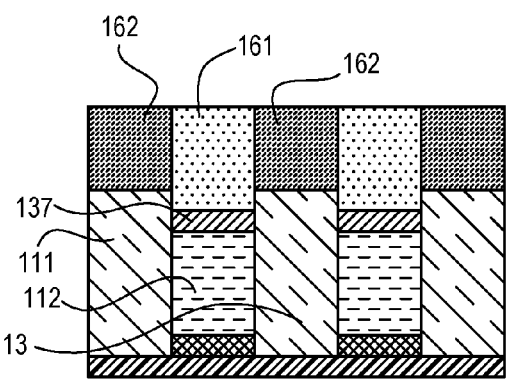
Figure 9B:
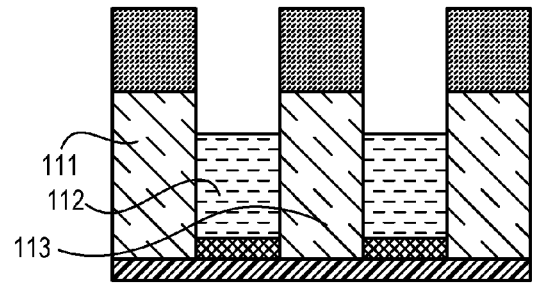

Referring now to FIG. 8B, in one such example embodiment, after depositing a block copolymer, phase-separation of the block copolymer mixture is caused such that self-assembly results in a first polymer structure 161 of a first polymer material positioned on the pre-pattern film 137 and approximately entirely covering the pre-pattern film 137 such that a first sidewall of the first polymer structure 161 is aligned with a vertical interface of the first structure 111 and second structure 112, and a second sidewall of the first polymer structure 161 is aligned with a vertical interface of the second structure 112 and the third structure 113. Self-assembly also results in second polymer structures 162 of a second polymer material positioned on the first structure 111 and on the third structure 113. The first polymer structure 161 is then removed, leaving the second polymer structures 162 defining a self-aligned mask for subsequent etch processes as illustrated in FIG. 9B. Accordingly, a self-aligned etch mask is created that protects adjacent or surrounding structures and/or materials, while precisely defining an etch location for transferring a defined pattern without requiring additional lithographic patterning. In other words, techniques herein can include selecting block copolymer parameters such that DSA material can self-assembly at either a 1:1 ratio, a 1:3 ratio, or otherwise depending on particular design objectives. Additional processing can be comparable to that shown in FIGS. 10-12. As can be appreciated, such a process can be applied to both line/space directed self-assembly, as well as contact/hole directed self-assembly of block copolymers, and can be used for logic applications, memory applications, contact etch, self-aligned VIA, etc.

Accordingly, techniques herein enable using directed self-assembly for inter-level self-alignment. In conventional techniques, there is a significant cost expenditure for patterning DSA because photoresist layers and photolithographic alignment techniques are used. In addition to the high cost, photolithographic alignment techniques can suffer from overlay misalignment—especially at sub-resolution dimensions. With photolithography, patterns are aligned with various alignment marks and/or scribe lanes. Thus, photolithographic patterns are not directly registered to existing structures on a given substrate. By segregating directed self-assembly areas into isolated pockets using existing structures as described herein, no cut mask is need to make block copolymer lines useful. Accordingly, techniques herein provide a self-limiting, vapor-based slimming technique that creates a pattern from existing substrate structures, and this pre-pattern can be considered "free" in a sense. This existing pattern is also directly registered with existing structures eliminating any misalignment potential.

Note that techniques herein can be applied to any substrate that has two or three structures of a same initial height. A selective wetting condition is then established using pre-existing substrate structures thereby providing a DSA pre-pattern for preferential self-assembly that is directly registered to underlying structures instead of having to pattern sacrificial structures just to use directed self-assembly of block copolymers.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for self-aligned patterning, the method comprising:
   providing a substrate having a first structure of a first material, a second structure of a second material, and a third structure of a third material, the second material being different from the first material and the third material, the first structure and third structure both having a vertical interface with the second structure, the first structure being positioned on a first side of the second structure and the third structure being positioned on an opposing side of the second structure, a top surface of the first structure a top surface of the second structure and a top surface of the third structure all being horizontal and coplanar with each other;
   removing an upper portion of the second structure such that a resulting top surface of the second structure is vertically lower than the top surface of the first structure and vertically lower than the top surface of the third structure;
   depositing a planarization layer on the substrate, the planarization layer covering the first structure the second structure and the third structure, the planarization layer having a top surface that is horizontally planar;
   depositing a solubility-changing agent on the top surface of the planarization layer;
   activating the solubility-changing agent such that the solubility-changing agent changes a solubility of a top portion of the planarization layer, the top portion of the planarization layer extending vertically from the top surface of the planarization layer to at least to the top surface of the first structure and the top surface of the third structure; and
   removing the top portion of the planarization layer such that planarization layer material is removed from the top surface of the first structure and removed from the top surface of the third structure, such removal leaving a pre-pattern film on the resulting top surface of the second structure, the pre-pattern film comprised of remaining planarization layer material.

2. The method of claim 1, further comprising:
depositing a block copolymer mixture on the substrate; and
causing phase-separation of the block copolymer mixture such that self-assembly results in a first polymer structure of a first polymer material positioned on the pre-pattern film and positioned with a sidewall of the first polymer structure aligned with the vertical interface of the first structure and second structure, self-assembly also resulting in a second polymer structure of the first polymer material positioned on the pre-pattern film and positioned with a sidewall of the second polymer structure aligned with the vertical interface of the third structure and second structure, self-assembly also resulting in a third polymer structure of a second polymer material positioned between the first polymer structure and the second polymer structure.

3. The method of claim 2, wherein a top surface of the pre-pattern film is positioned below the top surface of the first structure and the top surface of the third structure such that sidewalls of the first structure and the third structure are exposed; and
wherein a sidewall of the first polymer structure abuts with a sidewall of the first structure, and a sidewall of the second polymer structure abuts with a sidewall of the third structure.

4. The method of claim 2, wherein the first polymer material is etch resistant relative to the second polymer material and a predetermined etch chemistry.

5. The method of claim 2, further comprising:
removing the third polymer structure while the first polymer structure and the second polymer structure remain on the substrate.

6. The method of claim 5, further comprising:
executing an etch step that uses the first structure, the third structure, the first polymer structure and the second polymer structure as a mask for etching through the second structure of the second material.

7. The method of claim 1, further comprising:
depositing a block copolymer mixture on the substrate; and
causing phase-separation of the block copolymer mixture, wherein the block copolymer mixture is selected to self-assemble with at least three structures on the pre-pattern film between the first structure and the third structure such that polymer structures of a first polymer material are positioned at opposing edges of the pre-pattern film at the vertical interfaces of the second structure with the first structure and with the third structure, self-assembly also including a structure of a second polymer material positioned on the pre-pattern film between the polymer structures of the first polymer material.

8. The method of claim 1, wherein removing the upper portion of the second structure includes executing an etch process that selectively etches the second material relative to the first material and the third material.

9. The method of claim 8, wherein executing the etch process includes executing a non-plasma gaseous etch process.

10. The method of claim 9, wherein executing the etch process includes executing a chemical oxide removal process using HF and $NH_3$.

11. The method of claim 1, wherein the pre-pattern film has a wetting angle that differs from a wetting angle of the first material and from the second material.

12. The method of claim 1, wherein depositing the planarizing layer includes depositing a developable anti-reflective coating.

13. The method of claim 1, wherein the solubility-changing agent includes an acid.

14. The method of claim 1, wherein depositing the solubility-changing agent includes using vapor exposure deposition.

15. The method of claim 1, wherein activating the solubility-changing agent includes heating the solubility-changing agent such that the solubility-changing agent diffuses into the planarization layer to a predetermined depth and changes a solubility of the top portion of the planarization layer.

16. The method of claim 15, wherein heating the solubility-changing agent includes controlling heating parameters such that diffusion of the solubility-changing agent stops at about the predetermined depth.

17. The method of claim 1, wherein a top surface of the pre-pattern film is lower than the top surface of the first structure and the top surface of the third structure such that a sidewall of the first structure and a sidewall of the third structure are exposed providing a relief pattern for self-assembly of block copolymers.

18. The method of claim 1, wherein the first material and the third material are identical.

19. The method of claim 1, wherein the second material is an oxide, and wherein the first material and the third material are silicon nitride.

20. The method of claim 1, wherein the first structure and the third structures are gate structures of a transistor.

* * * * *